(12) United States Patent
Endou

(10) Patent No.: US 6,359,502 B1
(45) Date of Patent: Mar. 19, 2002

(54) SEMICONDUCTOR CIRCUIT HAVING ISOLATED OSCILLATOR

(75) Inventor: Youichi Endou, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/426,497

(22) Filed: Oct. 26, 1999

(30) Foreign Application Priority Data

Nov. 10, 1998 (JP) ............................................ 10-319514

(51) Int. Cl.[7] .................................................. G05F 1/10
(52) U.S. Cl. ...................................... 327/545; 327/565
(58) Field of Search ................................ 257/207, 691; 327/379, 530, 531, 532, 536, 545, 564, 565, 566; 365/189.09, 226

(56) References Cited

U.S. PATENT DOCUMENTS

| | | | | | |
|---|---|---|---|---|---|
| 5,121,036 A | * | 6/1992 | Fuji | ............................ | 307/303 |
| 5,204,554 A | * | 4/1993 | Ohannes et al. | ............. | 307/443 |
| 5,469,399 A | * | 11/1995 | Sato et al. | ................... | 365/226 |
| 5,717,359 A | * | 2/1998 | Matsui et al. | ................ | 327/565 |
| 5,926,061 A | * | 7/1999 | Usui | ........................... | 327/538 |
| 5,969,390 A | * | 10/1999 | Kranzen | ...................... | 257/363 |

* cited by examiner

Primary Examiner—Jeffrey Zweizig
(74) Attorney, Agent, or Firm—Adams & Wilks

(57) ABSTRACT

A semiconductor circuit in which propagated noise from high-speed switching is reduced even if chip size is downsized, by comprises a first circuit such as a DC-DC converter having an oscillating circuit therein, a second circuit having no oscillating circuit, a connection pad connected to a power supply, a first power line and a second power line. A first resistor is disposed on the first power line, and a second resistor, preferably of equal resistance value to that of the first resistor, is disposed on the second power line. By providing resistors on the both or at least. one of the power lines, high-frequency noise generated by the DC-DC converter and propagated to the second circuit through the power lines is reduced.

20 Claims, 2 Drawing Sheets

SEMICONDUCTOR CIRCUIT HAVING ISOLATED OSCILLATOR

BACKGROUND OF THE INVENTION

The present invention relates to a semiconductor circuit, and more particularly to a semiconductor circuit in which a power line which is supplied to a circuit having an oscillating circuit and a circuit having no oscillating circuit is divided into two lines.

For, example, in a semiconductor circuit having a switching regulator of the charge pump type therein, there is conducts a high-speed switching operation and other circuits are arranged on one chip. In a circuit of this type, there is a case in which a noise propagated from the circuit that conducts the high-speed switching operation through the power line occurs in other circuits.

Under these circumstances, until now, the power line which is supplied to the circuit that conducts the high-speed switching operation and the power line which is supplie to the circuit that conducts a low-speed switching operation are divided, to thereby reduce the noise which is propagated from the circuit that conducts the high-speed switching operation.

SUMMARY OF THE INVENTION

In the case where a semiconductor device is large in size, a floating capacitor C occurs in the wiring of the divided power circuits, and a wiring resistor R and the floating capacitor C make it possible to reduce the noise propagation caused by the high-speed switching operation.

However, in case of a semiconductor circuit a chip size of which is, for example, about 2 mm square, because the wiring per se of the power circuit is shortened, a sufficient floating capacitor C and wiring resistor R cannot be obtained with the result that a time constant becomes small, and the propagated noise caused by the high-speed operation cannot be sufficiently reduced by merely dividing the power line.

In view of the above, an object of the present invention is to provide a semiconductor circuit which is capable of sufficiently reducing the propagated noise caused by the high-speed switching operation even if the semiconductor circuit is downsized.

According to the present invention, there is provided a semiconductor circuit, comprising: a first circuit having an oscillating circuit for conducting a switching operation at a high speed; a second circuit having no oscillating circuit; a power terminal connected with a power supply; a first power line for connecting the power terminal and the first circuit to each other; a second power line for connecting the power terminal and the second circuit to each other; and a resistor disposed on at least one of the first power line and the second power line. The provision of the resistor on the power line permits a high-frequency noise the occurs in the first circuit and is propagated to the second circuit through the power line to be reduced.

It is preferable from the viewpoints of a voltage drop due to the resistor and the arrangement of the resistor that the resistor is disposed on each of the first power line and the second power line, and the resistances of both the resistors are identical with each other.

Also it is preferable from the viewpoint of a reduction of power loss that the resistor is disposed on each of the first power line and the second power line, and the resistances of the respective resistors have such values that electric energy consumed in the first circuit and the second circuit within a given period are equal to each other.

Further, it is preferable that the resistor is formed of a polysilicon resistor.

Still further, the first circuit may be formed of a DC-DC convertor circuit of the charge pump type.

BRIEF DESCRIPITON OF THE DRAWINGS

DESCRIPTION OF THE PREFERRED EMBODIMENTS

Hereinafter, a description will be given of a semiconductor circuit in accordance with preferred embodiments of the present invention with reference to the accompanying drawings.

Figure 1:
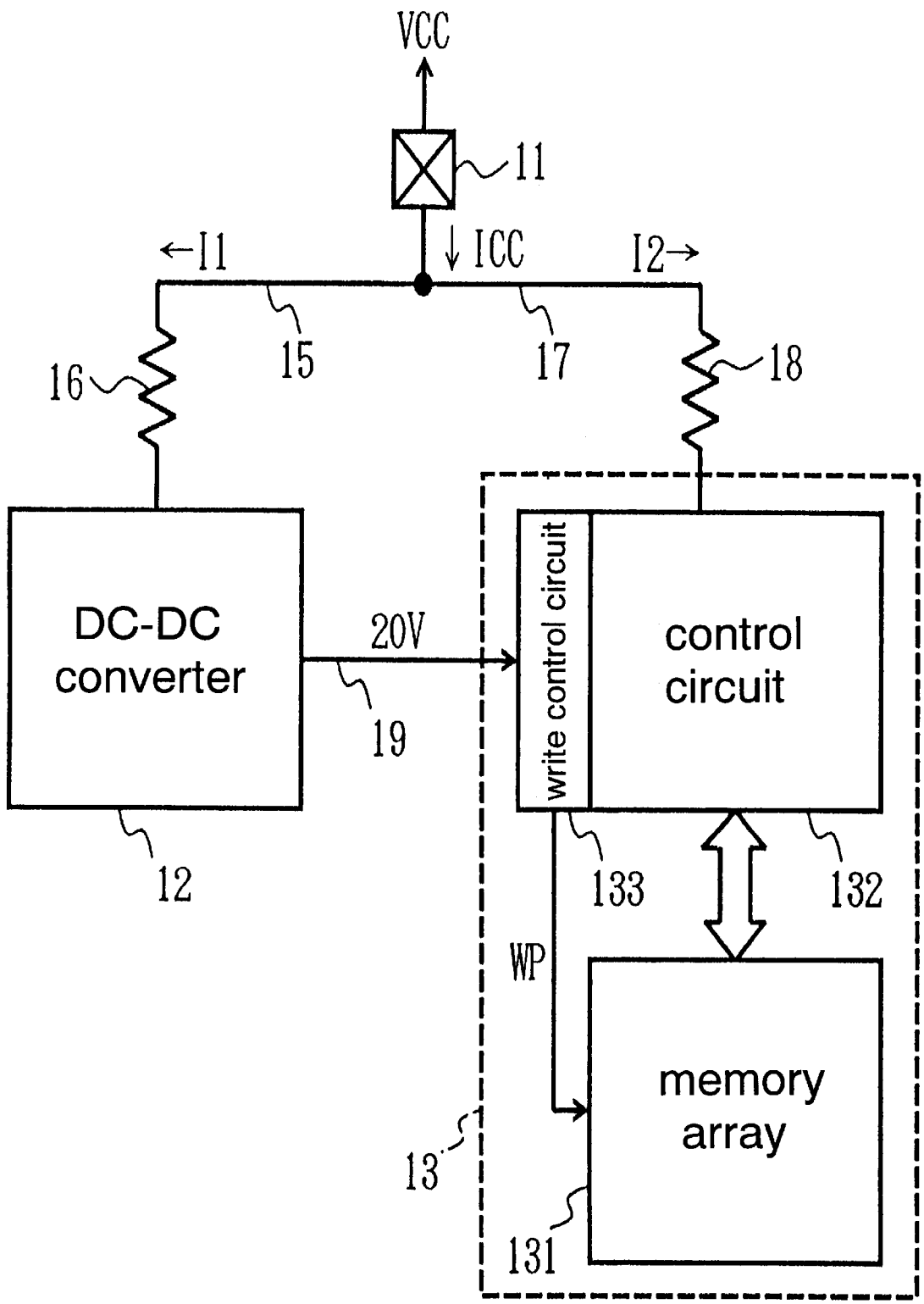
FIG. 1 is a structural diagram showing a semiconductor circuit in the case where an EEPROM is applied to the semiconductor circuit in accordance with a first embodiment of the present invention.

FIG. 1 shows the structure of a semiconductor circuit, and more particularly shows the structure of a semiconductor circuit in the case where an EEPROM (electrically erasable and programmable ROM) is applied to the semiconductor circuit.

As shown in FIG. 1, the semiconductor circuit includes a pad 11, a DC-DC convertor 12 and a storage/control section 13. The pad 11 is connected to the DC-DC convertor 12 through a first power line 15 and connected to the storage/control section 13 through a second power line 17.

Disposed on the first power line 15 is a first resistor 16, and disposed on the second power line 17 is a second resistor 18.

The pad 11 in the semiconductor circuit functions as a power terminal connected with a power supply VCC. A power from the power supply VCC is supplied to the DC-DC convertor 12 and the storage/control section 13 through the pad 11 and the first power line 15 and the second power line 17 into which the power line have been divided. The power supply VCC is appropriately selected in accordance with the semiconductor circuit as used, but a voltage of 5.5 to 1.8 V is applied in case of the EEPROM in this embodiment.

The DC-DC convertor 12 includes an oscillating circuit not shown therein and functions as a first circuit. The DC-DC convertor 12 is a booster circuit of the charge pump type which boosts a voltage applied from the power supply VCC to 20 V and normally oscillates at f=2 MHz for a period of 4 ms when writing data in the storage/control section 13.

The voltage of 20V which has been boosted by the DC-DC convertor 12 is applied to a write control circuit 133 in the storage/control section 13 through a third power line 19.

The storage/control section 13 includes a memory array 131, a control circuit 132 and the write control circuit 133, and functions as a second circuit having no oscillating circuit.

The memory array 131 is a portion where data or a program is stored and conducts writing or erasing of the data or program supplied from the control circuit 132 in response to a write control signal WP supplied from the write control circuit 133.

The control circuit 1332 that is connected to an external CPU of the semiconductor circuit through a bus line not shown, supplies data, etc., supplied externally to the memory array 132 and controls the drive of the write control circuit 133.

The write control circuit 133 is designed so as to supply the write control signal WP to the memory array 131 under drive control by the control circuit 132, upon receiving a voltage supply of 20V from the DC-DC convertor 12 when writing, reading or erasing data or the like.

A first resistor 16 is disposed on the first power line 15, and a current I1 is supplied to the DC-DC convertor 12 from the power supply VCC which is externally connected to the pad11. Also, the second resistor 18 is disposed on the second power line 16, and a current I2 is supplied to the control circuit 132 from the power supply VCC which is externally connected to the pad 11. A current ICC=I1+I2 which is supplied to the semiconductor circuit from the pad 11 is normally about 1 mA.

As the first resistor 16 and the second resistor 18, wiring made of polysilicon is employed. The first power line 15 and the second power line 17 except for the first and second resistors 16 and 18 are made of aluminum and wired.

The resistances of the first resistor 16 and the second resistor 18 are 30Ω, respectively, and the series resistor betwee n the DC-DC convertor 12 and the storage/control section 13 is 60Ω in resistance. Because areas where the polysilicon wirings are disposed are identical with each other by setting both the resistances to the same value, case of manufacture is facilitated.

Also, because the series resistor of 60Ω is divided into the first resistor 16 on the first power line 15 and the second resistor 18 on the second power line 17, a voltage drop in both the power lines 15 and 17 can be reduced.

Subsequently, the operation of the EEPROM (semiconductor circuit) thus structured will be described.

In the case where all of the current ICC (about 1 mA) supplied from the power supply VCC is supplied to one of the first resistor 16 and the second resistor 18, a voltage drop across the resistors 16 and 18 becomes maximum. However, even in this case, because of the voltage drop of 30 mV at the maximum, there arises no problem in the operation of the DC-DC convertor 12 and the storage/control section 13.

In the case where data is written in the EEPROM, the DC-DC convertor 12 boosts a voltage from the power supply VCC to 20 V and supplies the boosted voltage to the write control circuit 133.

The write control circuit 133 receives the voltage of 20 V from the DC-DC convertor 12 and supplies a write control signal WP at a given timing. As a result, the data supplied from the control circuit 132 is stored in a predetermined portion of the memory array.

In thus writing the d ata into the memory array, the DC-DC convertor 12 allows a through current to flow and generates a noise when conducting high-speed switching (frequency f=2 MHz) by use of the internal oscillating circuit. The noise generated by the DC-DC convertor 12 would normally be propagated to the control circuit 132 connected to the DC/DC convertor 12 through the first power line 15 and the second power line 18.

However, according to the semiconductor circuit of the present invention, because the series resistor (the first resistor 16 and the second resistor 18) of 60Ω in total is disposed between the DC-DC convertor 12 and the storage/control section 13, an RC filter is formed by the floating capacitor C generated in the first power line 15 and the second power line 17. As a result, even if the noise occurs in the DC-DC convertor 12, it is cut off by the filter formed in the power lines 15 and 17, to thereby reduce the noise propagated to the storage/control section. Hence, malfunction or data error is prevented from occurring.

Subsequently, a second embodiment will be described. In this embodiment, the semiconductor circuit is applied to a liquid crystal drive circuit. Parts identical with those in the first embodiment shown in FIG. 1 are designated by the same reference numeral, and their description will be appropriately omitted.

Figure 2:
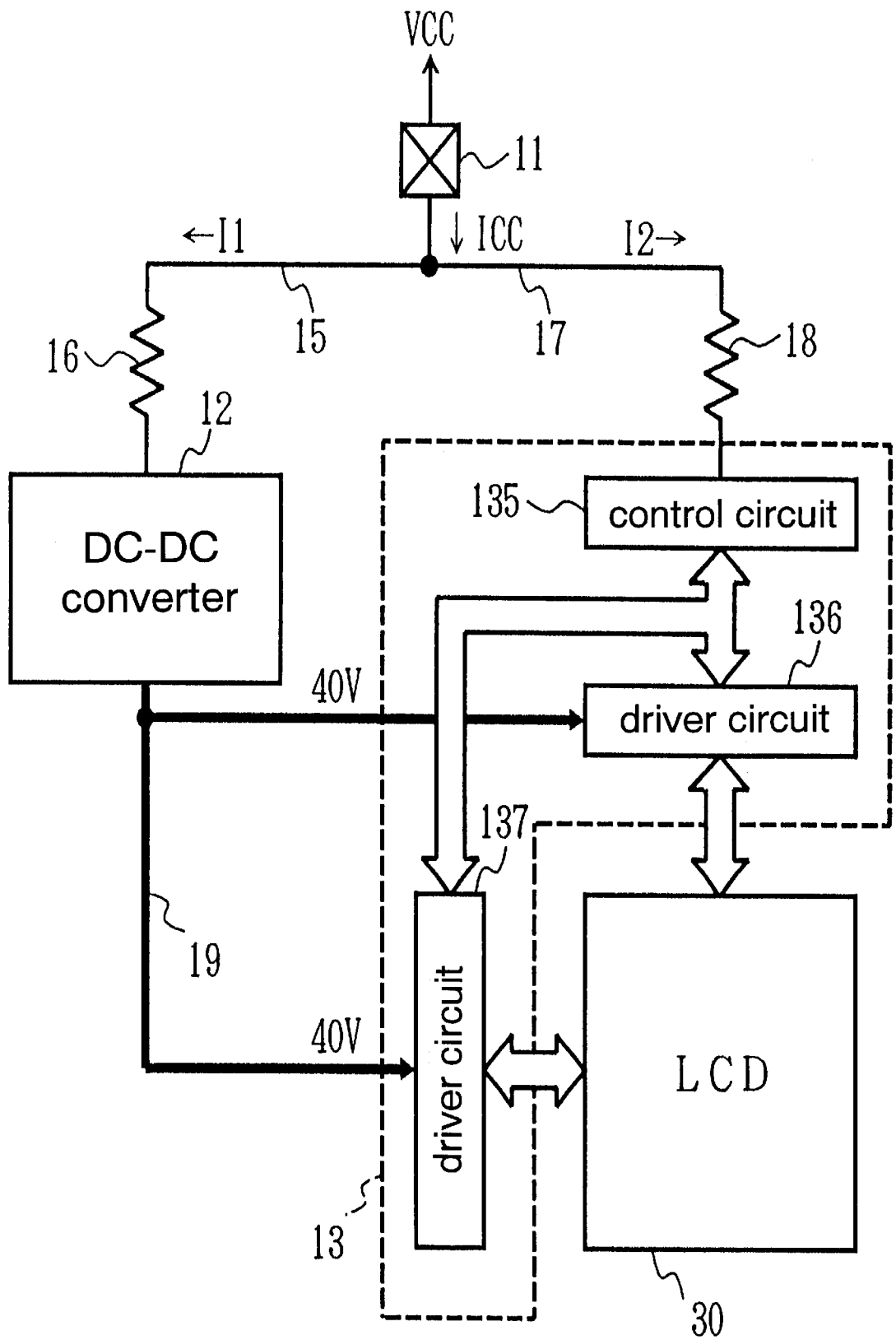
FIG. 2 is a structural diagram showing a liquid crystal drive circuit being applied to a semiconductor circuit in accordance with a second embodiment of the present invention.

FIG. 2 is a structural diagram showing a liquid crystal drive circuit and an LCD (liquid crystal display unit).

As show n in FIG. 2, the liquid crystal drive circuit (semiconductor circuit) is designed so as to display the display data supplied from a CPU not shown or the like on an LCD 30.

In this embodiment, the DC-DC convertor 12 that functions as the first circuit boosts the voltage from the power supply VCC to 40 V and supplies the voltage thus boosted to the driver circuits 136 and 137.

In the liquid crystal drive circuit thus structured, also, the noise is generated when the DC-DC convertor 12 boosts the supply voltage to 40 V as in the case of EEPROM. However, because the series resistor of 60Ω in total which consists of 30Ω of the first resistor 16 and 30Ω of the second resistor 18 is disposed on the first power line 15 and the second power line 18, the propagation of the noise to the second circuit 13 side is reduced.

As described above, according to the first and second embodiments, even if a noise occurs when the DC-DC convertor 12 boosts the supply voltage up to a given voltage by use of the internal oscillating circuit, because the noise always passes through the series resistor (the first resistor 16 and the second resistor 18) in propagation of the noise on the power lines 15 and 17, a filter consisting of the floating capacitor C and the resistor makes it possible to reduce the noise propagated up to the second circuit.

Also, according to this embodiment, since the first resistor 16 and the second resistor 18 are made of polysilicon normally used in the semiconductor circuit, the arrangement of the resistor is facilitated.

Further, according to this embodiment, since the series resistor 60Ω is divided into the 30Ω of the first resistor 16 and the 30Ω of the second resistor 18, the voltage drop across both the resistors 16 and 18 can be minimized.

The preferred embodiment of the present invention was described above. However, the present invention is not limited by or to the structure of the above embodiment and can be applied to other embodiments or modified within the scope of the present invention as claimed in the respective claims.

For example, in this embodiment, although a synthetic resistance (series resistance) consisting of the first resistor 16 and the second resistor 18 is set to 60Ω, it may be appropriately selected in response to the chip size of the semiconductor circuit, a distance of the respective power lines 15 and 17, etc. For example, the synthetic resistance R may be set to 50, 40, 30, 70 and 80Ω other than R=60Ω in response to the semiconductor circuit. Similarly in th is case, if both the values of the first resistor and the second resistor are set to R/2, the voltage drop can be lowered and the arrangement of the resistors can be facilitated.

Further, in the embodiment and the above modified example, the values of the first resistor 16 and the second resistor 18 are made equal to each other. However, it is not always appropriate to make them equal to each other. In other words, assuming that the resistance of the first resistor 16 is R1, the resistance of the second resistor 18 is R2 and the series resistance (total resistance) sufficient to reduce the noise is R, if the condition of R1+R2=R is satisfied, it is unnecessary to satisfy R1=R2. For example, in case of R=60Ω, R1 can be selected from 0, 10, 20, 40, 50 or 60Ω. However, in case of R1=0Ω(R2=R−R1), the first resistor 16 is not disposed on the power line 15, and in case of R2=0Ω(R1=R−R2), the second resistor 18 is not disposed on the power line 17. In this way, in the case where one of the first resistor 16 and the second resistor 18 is 0Ω, because the other resistor becomes maximum in resistance, its voltage drop increases. However, if the voltage drop is to the degre where there arises no problem on the operation of the circuit it is advantageous in that the number of arranged resistors one.

It is to be noted that the selection (resistance allocation) of the resistances R1 and R2 (R1+R2=R) may be made to satisfy I1×R1=I2×R2.

Also, taking the power loss caused by the first and second resistors 16 and 18 into consideration, R1 and R2 may be selected such that the electric energy consumed by the first resistor 16 and the second resistor 18 becomes equal to each other within a given period (for example, 1 hour, 8 hours, 1 day, 1 week and one month)

In the above-described embodiment, the EEPROM and the liquid crystal drive circuit were described as an applied example of the semiconductor circuit. However, the present invention may be applied to another semiconductor circuit including the first circuit having an oscillating circuit and the second circuit having no oscillating circuit.

For example, the present invention may be applied to another memory such as a flash memory, a DSP (digital signal processor) or the like.

Also, in the above-described embodiment, although a case where the DC-DC convertor is employed as the first circuit having an oscillating circuit was described as an example. However, another circuit may be set as the first circuit if the circuit has an oscillating circuit.

According to the present invention, since a resistor is disposed on the power line, even if the semiconductor circuit is ldownsized, the propagation of the noise generated in the first circuit to the second circuit can be reduced.

What is claimed is:

1. A semiconductor circuit, comprising: a first circuit for performing a first function and having an oscillating circuit for conducting a switching operation at a high speed; a second circuit for performing a second function and having no oscillating circuit therein, the second circuit being driven by an output signal of the oscillating circuit; a power supply terminal connectable to a power supply for supplying power to the first and second circuits; a first power line for connecting the power supply terminal and the first circuit to each other; a second power line for connecting the power supply terminal and the second circuit to each other; and a resistor disposed on at least one of the first power line and the second power line to reduce propagation of noise from the first circuit to the second circuit.

2. A semiconductor circuit according to claim 1; wherein the resistor is disposed on each of the first power line and the second power line, and the resistance values of the respective resistors are identical with each other.

3. A semiconductor circuit according to claim 1; wherein the resistor is disposed on each of the first power line and the second power line, and the resistance values of the respective resistors are set such that the power consumed by the first circuit and the second circuit within a given time period are equal to each other.

4. A semiconductor circuit according to any one of claims 1, 2 or 3; wherein the resistor comprises a polysilicon resistor.

5. A semiconductor circuit according to any one of claims 1, 2 or 3; wherein the first circuit comprises a DC-DC converter circuit of the charge pump type.

6. A semiconductor circuit according to claim 1; wherein the oscillating circuit comprises a DC-DC converter for producing a boosted output voltage; and further comprising a first driver circuit driven by the boosted output voltage for driving a signal electrode side of a display panel, a second driver circuit driven by the boosted output voltage for driving a scanning electrode side of the display panel, and a control circuit for controlling the first and second driver circuits.

7. A semiconductor circuit according to claim 1; wherein a resistor is disposed on each of the first and second power lines.

8. A semiconductor circuit according to claim 7; wherein resistance values of the respective resistors are the same.

9. A semiconductor circuit according to claim 8; wherein the resistance value of the respective resistors is about 30Ω.

10. A semiconductor circuit according to claim 1; wherein the oscillating circuit comprises a DC-DC converter for producing a boosted output voltage, and the second circuit comprises a storage/control section of an EEPROM.

11. A semiconductor circuit according to claim 10; wherein the storage/control section comprises a memory array for storing data, a write control circuit for receiving the boosted output voltage of the DC-DC converter and supplying a write control signal for writing data to the memory array, and a control circuit for controlling access to the memory array for the writing or reading of data.

12. A semiconductor circuit according to claim 11; wherein a first current flowing through the first power line and a second current flowing through the second power line together equal about 1 mA during operation of the semiconductor circuit.

13. A semiconductor circuit comprising:

an oscillator for performing a high-speed switching operation;

a circuit having no oscillator for performing a given function; a single power supply terminal connected to a power supply, the oscillator and the circuit having no oscillator for supplying power to the oscillator and the circuit having no oscillator; a first power line connecting the power supply terminal to the oscillator; a second power line connecting the power supply terminal to the circuit having no oscillator; and a resistor disposed in each of the first and second power lines for reducing noise propagation from the oscillator to the circuit having no oscillator.

14. A semiconductor circuit according to claim 13; wherein the circuit having no oscillator is being driven by the oscillator.

15. A semiconductor circuit according to claim 13; wherein resistance values of the respective resistors are identical.

16. A semiconductor circuit according to claim 13; wherein the respective resistors are comprised of polysilicon.

17. A semiconductor circuit according to claim 13; wherein the oscillator comprises a DC-DC converter of the charge pump type.

18. A semiconductor circuit according to claim 13; wherein the resistance value of the respective resistors is about 30Ω.

19. A semiconductor circuit according to claim 13; wherein the oscillator comprises a DC-DC converter for producing a boosted output voltage; and the circuit having no oscillator comprises a storage/control section of an EEPROM.

20. A semiconductor circuit according to claim 19; wherein the storage/control section comprises a memory array for storing data, a write control circuit for receiving the boosted output voltage of the DC-DC converter and supplying a write control signal for writing data to the memory array, and a control circuit for controlling access to the memory array for the writing or reading of data.

* * * * *